(12) United States Patent
Manku et al.

(10) Patent No.: US 7,715,814 B2
(45) Date of Patent: May 11, 2010

(54) METHOD AND SYSTEM FOR SPURIOUS SIGNAL CONTROL IN RECEIVERS

(75) Inventors: Tajinder Manku, Waterloo (CA); Masoud Kahrizi, Irvine, CA (US)

(73) Assignee: Icera Canada ULC, Calgary (CA)

( * ) Notice: Subject to any disclaimer, the term of this patent is extended or adjusted under 35 U.S.C. 154(b) by 412 days.

(21) Appl. No.: 11/569,031

(22) PCT Filed: May 13, 2005

(86) PCT No.: PCT/CA2005/000732

§ 371 (c)(1),
(2), (4) Date: Nov. 13, 2006

(87) PCT Pub. No.: WO2005/112281

PCT Pub. Date: Nov. 24, 2005

(65) Prior Publication Data
US 2008/0014894 A1    Jan. 17, 2008

Related U.S. Application Data

(60) Provisional application No. 60/572,298, filed on May 17, 2004.

(30) Foreign Application Priority Data
May 13, 2004    (CA) .................................... 2467201

(51) Int. Cl.
*H04B 1/10* (2006.01)
*H04B 1/26* (2006.01)
(52) U.S. Cl. ..................... 455/296; 455/318; 455/323
(58) Field of Classification Search .............. 455/296, 455/302, 313–317, 323, 324
See application file for complete search history.

(56) References Cited

U.S. PATENT DOCUMENTS 4,661,995 A * 4/1987 Kashiwagi ............... 455/183.2
5,097,221 A * 3/1992 Miller ......................... 329/318

(Continued)

FOREIGN PATENT DOCUMENTS

WO    WO 01/17120    3/2001
WO    WO 03/071673    * 8/2003

OTHER PUBLICATIONS

Manku, T., "Single Chip CMOS Direction Conversion Transceivers for WWAN and WLAN", Hot Chips 16, A Symposium on High Performance Chips, Aug. 22-24, 2004, Stanford University, accessed from http://www.hotchips.org/archives/hc16/2_Mon/12_HC16_Sess2_Pres2_bw.pdf see slide titled Virtual LOtm and Dynamic Spurious Control (DSC).
PCT/CA2005/000732, International Search Report and Written Opinion, 14 pages, Aug. 16, 2005.
PCT/CA2005/000732, International Preliminary Report on Patentability, 8 pages, Nov. 14, 2006.

*Primary Examiner*—Duc M Nguyen
(74) *Attorney, Agent, or Firm*—Dennis R. Haszko

(57) ABSTRACT

A method and system for dynamically shifting spurious tones away from the desired frequency in a virtual local oscillator receiver, such that any undesired signal residing at such spurious tones are effectively delineated from the desired signal and removed from the RF input signal. The system detects the presence of potential undesired blocker signals in the RF input signal, and initiates an iterative power comparison and mixer signal adjustment loop. As the virtual local oscillator uses two mixer signals, the frequency of one of the mixer signals is adjusted during the loop until the power of the down-converted signal is minimized to a predetermined level. Minimized power in the down-converted signal is indicative of the absence of the blocker signal, since the presence of a relatively high power signal is indicative of a blocker signal overlapping with a desired signal.

7 Claims, 7 Drawing Sheets

U.S. PATENT DOCUMENTS

| | | | |
|---|---|---|---|
| 5,307,515 A * | 4/1994 | Kuo et al. | 455/295 |
| 5,564,097 A * | 10/1996 | Swanke | 455/302 |
| 5,847,612 A * | 12/1998 | Birleson | 331/2 |
| 6,567,654 B1 * | 5/2003 | Coronel Arredondo et al. | 455/315 |
| 6,727,764 B2 | 4/2004 | Manku et al. | |
| 6,785,527 B2 * | 8/2004 | Earls | 455/323 |
| 6,807,405 B1 * | 10/2004 | Jagger et al. | 455/296 |
| 6,973,297 B1 * | 12/2005 | Manku et al. | 455/323 |

\* cited by examiner

METHOD AND SYSTEM FOR SPURIOUS SIGNAL CONTROL IN RECEIVERS

RELATED APPLICATIONS

This application is a 371 national stage patent application of PCT/CA05/00732, filed May 13, 2005, which claims priority to U.S. Provisional Application No. 60/572,298, filed May 17, 2004, and further claims priority to Canada Patent Application No. 2467201 filed May 13, 2004, the contents of which are incorporated herein by reference in their entirety.

FIELD OF THE INVENTION

The present invention relates generally to communications, and to down-conversion of an RF signal to a lower frequency in a radio. More specifically, the present invention relates to management of spurious components generated by the radio.

BACKGROUND OF THE INVENTION

Many communication systems up-convert electromagnetic signals from base band to higher frequencies for transmission, and subsequently down-convert those high frequencies back to their original frequency band when they reach the receiver, processes known as up-conversion and down-conversion (or modulation and demodulation) respectively. The original (or base band) signal, may be, for example, data, voice or video. These base band signals may be produced by transducers such as microphones or video cameras, be computer generated, or transferred from an electronic storage device. In general, the high frequencies provide longer range and higher capacity channels than base band signals, and because high frequency radio frequency (RF) signals can propagate through the air, they can be used for wireless transmissions as well as hard-wired or fibre channels.

All of these signals are generally referred to as radio frequency (RF) signals, which are electromagnetic signals; that is, waveforms with electrical and magnetic properties within the electromagnetic spectrum normally associated with radio wave propagation.

A typical artefact resulting from the down-conversion process are blocking signals, also termed spurious components, generated by the radio which can desensitize the receiver. These blocking signals appear at an unwanted radio frequency, and can desensitize the receiver by raising the noise floor, causing a reduction in the overall gain of the receiver, or a combination of both.

Many different receiver architectures have been proposed and used for mitigating the effect of blocking signals. These include super-heterodyne, image rejection, direct conversion, near zero-IF conversion and harmonic mixing architectures. A brief summary of these architectures follows.

The super-heterodyne receiver uses a two-step frequency translation method to convert the signal at RF to a base band signal. First, the incoming signals and corruptive noise are passed through a band pass filter that attenuates out of band signals and passes the desired signal. At this stage some of the blocking signals that are out of band are filtered. The desired signal, plus residual blocking signals, are amplified and mixed with a first local oscillator. This causes both a down-conversion and an up-conversion in the frequency domain. Usually the down-converted portion is retained at the so-called "Intermediate Frequency" (IF). Further filtering is performed on the signal at the IF frequency using a discrete device. This filter is a band pass filter and retains the radio channel required and further reduces the residual blocking signal. The signal is then mixed with a second oscillator that causes frequency translation to base band. The disadvantages of the super-heterodyne architecture include the requirement for an expensive off chip IF filter, a frequency plan fixed in hardware, and locations of spurious signals that are fixed relative to the RF wanted signal in hardware, meaning that they cannot be changed using a software change.

There are several image rejection architectures that have been proposed, and among these, the two most well known are the Hartley Image Rejection Architecture and the Weaver Image Rejection Architecture. Here a spurious signal is created and is located at a fixed location in frequency relative to frequency of the wanted signal. This spurious signal is commonly referred to as the imagining frequency. The imagining blocking signal is removed using a combination of phase shifters and adders that are applied directly to the radio signal itself or/and the local oscillator (LO) signal. Some methods employ poly-phase filters to cancel the image components. Generally, either accurate phase shifters or accurate generation of a quadrature-mixing signal are employed in these architectures to cancel the image frequency. The amount of image (or blocker) cancellation is directly dependent upon the degree of accuracy in producing the phase shift or in producing the quadrature mixing signals. Although the integratability of these architectures is high, their performance is relatively poor due to the required accuracy of the phase shifts and quadrature oscillators. Another disadvantage here is the location of the blocker signal (or image frequency) is fixed relative to the wanted signal and cannot be moved to another location.

Direct conversion architectures perform the RF to base band frequency translation in a single step. The RF signal is mixed with a local oscillator at the carrier frequency. There is therefore no image frequency, and no image components to corrupt the signal. Direct conversion receivers offer high integration, but also have several important problems. Classical direct conversion receivers have thus far proved useful only for signalling formats that do not place appreciable signal energy near DC after conversion to base band. Though direct conversion does not suffer from blocking signals in general, there are several typical problems found in integrated direct conversion receivers. The noise near base band (i.e. 1/f-noise) corrupts the desired signal, the local oscillator leaks, which creates DC offsets and causes desensitization, noise inherent to mixed-signal integrated circuits corrupts the desired signal, and large on-chip capacitors are required to remove unwanted noise and signal energy near DC.

The near zero-IF conversion architecture is similar to the direct conversion architecture, in that the RF band is brought close to base band in a single step. The desired signal is not brought exactly to base-band however, and therefore DC offsets and 1/f noise do not contaminate the signal. Image frequencies (i.e. the blocker) are again a problem as in the super-heterodyne and image rejection architectures. Specific problems encountered with these architectures include a second down conversion being performed in the digital domain due to spurious issues, a fixed frequency of the image based on the frequency planning which cannot be changed, the need for several balanced signal paths for image cancellation, corruption of the desired signal due to noise inherent to mixed-signal integrated circuits, and the filters used to filter the IF signal inherently contributes to the frequency planning, making them standard specific.

The harmonic mixing architecture uses a number of mixing signals that are phase shifted by some desired amount. If x(t) is the incoming RF signal, and $\alpha_1$, $\alpha_2$, and $\alpha_3$ are the mixing signals, the output of a harmonic mixing structure equals $x(t)*(\alpha_1+\alpha_2+\alpha_3)$. In this example, there are assumed to be three mixing signals. Here, $\alpha_1$, $\alpha_2$, and $\alpha_3$ are constructed so that when they add they have significant energy at the wanted carrier frequency. The frequency of $\alpha_1$, $\alpha_2$, and $\alpha_3$ are usually the same. In all cases, $a\alpha_1+\alpha_2+\alpha_3$ will have other frequency components other than the wanted carrier frequency. This produces a fixed spurious response. The disadvantage here is the spurious components are fixed based on the frequency planning of the additive signals (for example $\alpha_1$, $\alpha_2$, and $\alpha_3$).

The virtual local oscillator (VLO) receiver architecture described in commonly owned U.S. Pat. No. 6,727,764, the contents of which are incorporated herein by reference, is directed to the generation of signals used in the conversion process. The virtual local oscillator receiver architecture has properties that overcome the image-rejection problems associated with heterodyne receivers and transmitters, and the LO-leakage and 1/f noise problems associated with direct conversion receivers and transmitters. FIG. 1 generally illustrates the main concepts of the virtual local oscillator receiver architecture.

The VLO receiver 10 essentially consists of two mixers 12 and 14 that are connected together. Other parts of the receiver are not shown to simplify the schematic. At the LO ports of the mixers 12 and 14 the signals $\phi_1$ and $\phi_2$ are applied such that the overall RF signal x(t) is multiplied by a signal having significant power at the RF carrier frequency. FIG. 2 illustrates example $\phi_1$ and $\phi_2$ waveforms that can be applied to VLO receiver 10, and the resulting base band output signal $\phi_{\textit{eff}}$, which represents the actual desired local oscillator frequency. The resulting base band output signal $\phi_{\textit{eff}}=\phi_1*\phi_2$ has significant power at the RF frequency, but in practice there will be power generated in places other than the RF carrier frequency.

This power is denoted as unwanted power, the amount which is determined by the timing delay and frequency of signal $\phi_2$. FIG. 3 shows a possible $\phi_1*\phi_2$ spectrum where the desired signal at $\omega_{rf}$ has good power, but due to timing delay of $\phi_2$, additional tones will appear and are placed at harmonics of $\phi_2$ away from $\omega_{\textit{eff}}$. In the present example, the tones appear at $\omega_{rf}+200$ MHz and $\omega_{rf}-200$ MHz. Unfortunately, this unwanted power will down convert signals located at the unwanted power frequencies. For example, if there is unwanted power at $\omega_{rf}+200$ MHz in $\phi_1*\phi_2$ and there is an out off band blocker signal 20 at $\omega_{rf}+200$ MHz as shown in FIG. 4, this blocker 20 will eventually be down converted on top of the desired signal 22 if left uncorrected, as shown in FIG. 5. Since the two signals overlap, filtering will be ineffective for removing the blocker signal 20.

Accordingly, the VLO receiver receiving such an overlapping signal will drop the transmission since the overlapping signals will result in corrupted data that cannot be properly processed or simply resolved by the receiver.

It is, therefore, desirable to provide a method and system for reducing or eliminating blocker signals from an RF input signal that can desensitize a VLO receiver and potentially cause loss of received data.

SUMMARY OF THE INVENTION

It is an object of the present invention to obviate or mitigate at least one disadvantage of the previous blocker signal mitigation schemes. More specifically, it is an object of the present invention to modify the spurious profile by adjusting one of the mixer signals of the mixer signals used to generate an effective local oscillator signal used in a virtual local oscillator receiver. This results in an unwanted RF tone that does not overlap with a wanted signal at the desired frequency.

In a first aspect, the present invention provides a blocking signal reduction system for a virtual local oscillator receiver receiving an RF input signal and providing a corresponding base band signal. The system includes a synthesizer circuit, evaluation means and a dynamic correction circuit. The synthesizer circuit generates a first mixer signal and a second mixer signal. The virtual local oscillator receiver receives the first mixer signal and the second mixer signal for down converting the RF input signal to an effective local oscillator frequency, the down converted RF input signal being provided as the corresponding base band signal. The evaluation means receives the RF input signal and generates an enable signal when the RF input signal is determined to be deficient. The dynamic correction circuit senses a power of the base band signal, and provides a new frequency value in response to the enable signal, the synthesizer circuit adjusting a frequency of the second mixer signal to correspond with the new frequency value.

According to embodiments of the present aspect, the evaluation means can include base band processor circuits executing pre-set RF input signal status algorithms, or the evaluation means can include a blocker detection circuit coupled to the virtual local oscillator receiver for sensing a characteristic corresponding to the RF input signal, the blocker detection circuit generating the enable signal in response to the sensed characteristic exceeding a predetermined threshold.

In aspects of the present embodiment, the RF input signal can include RF input frames, and the corresponding base band signal can include base band frames. The dynamic correction circuit can include a power detector circuit, a comparator circuit, and a memory. The power detector circuit receives and senses the power of a first base band frame and the power of a second base band frame in response to the enable signal. The comparator circuit compares the power of the second base band frame to the power of the first base band frame, the comparator circuit generating a memory access signal when the power of the first base band frame is less than or equal to the power of the second base band frame. The memory stores a plurality of new frequency values, and provides one of said new frequency values to the synthesizer circuit in response to the memory access signal. The dynamic correction circuit can include a timer for controlling the power detector circuit to measure the power of the second base band frame at a set time after the power of the first base band frame is measured. The dynamic correction circuit can include a counter responsive to the memory access signal for providing each of the new frequency values.

In yet another aspect of the present embodiment, the blocker detection circuit can include a power sensing circuit, and the characteristic can include a signal power level of the RF input signal. In another aspect of the present invention, the virtual local oscillator receiver can include a variable gain amplifier and an automatic gain control circuit. The variable gain amplifier provides the base band signal. The variable gain amplifier receives a control voltage for maintaining gain of the base band signal at a predetermined value. The automatic gain control circuit receives the base band signal for generating the control voltage. The blocker detection circuit can include a gain comparison circuit for measuring a difference in gain between a first base band frame and a second base band frame, the gain comparison circuit generating the enable signal when the difference in gain exceeds the predetermined threshold.

In a second aspect, the present invention provides a blocking signal reduction system for a virtual local oscillator receiver receiving an RF input signal and providing a corresponding base band signal. The system includes a synthesizer circuit, a memory, and configuration logic. The synthesizer circuit generates a first mixer signal and a second mixer signal. The virtual local oscillator receiver receives the first mixer signal and the second mixer signal for down converting the RF input signal to an effective local oscillator frequency, the down converted RF input signal being provided as the corresponding base band signal. The memory stores preselected frequency values corresponding to specific channels and standards, the memory providing one of said stored preselected frequency values to the synthesizer circuit in response to an addressing signal. The configuration logic receives information corresponding to a standard and channel, the configuration logic generating the addressing signal in response to the standard and channel information. The synthesizer circuit adjusts a frequency of the second mixer signal to correspond with the one of said stored preselected frequency values.

In a third aspect, the present invention provides a method for eliminating a blocking signal in an RF input signal received by a virtual local oscillator receiver, the virtual local oscillator receiver receiving a first mixer signal and a second mixer signal for generating a corresponding base band signal. The method includes a) detecting the presence of the blocking signal in the RF input signal; b) changing a value of the second mixer signal; c) sensing a power of the corresponding base band signal; and d) repeating steps b) and c) until a preset condition is satisfied.

In embodiments of the present aspect, the RF input signal can include RF input frames, and the corresponding base band signal can include base band frames. The step of detecting can include measuring a power of the RF input signal and comparing the measured power to a predetermined threshold. In another embodiment, the step of detecting can include comparing a drop in gain of the base band signal to a predetermined value, and the step of detecting can include comparing the gain of a first base band frame to the gain of a second base band frame.

According to further embodiments of the present aspect, the step of sensing can include sensing a power of a first base band frame, the step of repeating can include sensing a power of a second base band frame and comparing the power of the second base band frame to the power of the first base band frame. The preset condition can be the second base band frame having a lower power than the first base band frame, and a table can store a predetermined number of frequency values. The step of repeating can include changing the value of the second mixer signal to correspond with a different frequency value stored in the table for each iteration. The preset condition can include having changed the value of the second mixer signal with all the frequency values stored in the table. A buffer can be used to store the frequency value of the second mixer signal corresponding to the base band frame having the lowest power.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for dynamically shifting spurious tones away from the desired frequency in a virtual local oscillator receiver, such that any undesired signal residing at such spurious tones are effectively delineated from the desired signal and removed from the RF input signal. The system detects the presence of potential undesired blocker signals in the RF input signal, and initiates an iterative power comparison and mixer signal adjustment loop. As the virtual local oscillator uses two mixer signals, the frequency of one of the mixer signals is adjusted during the loop until the power of the down-converted signal is minimized to a predetermined level. Minimized power in the down-converted signal is indicative of the absence of the blocker signal, since the presence of a relatively high power signal is indicative of a blocker signal overlapping with a desired signal.

Figure 1:
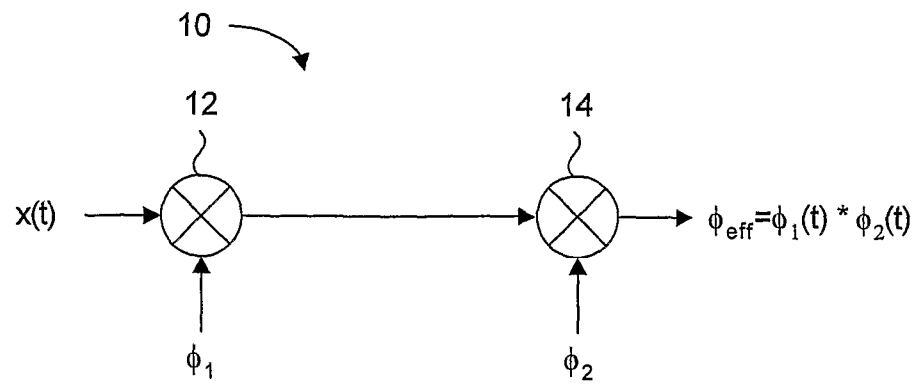
FIG. 1 is a general circuit schematic of a known virtual local oscillator receiver circuit.
Figure 2:
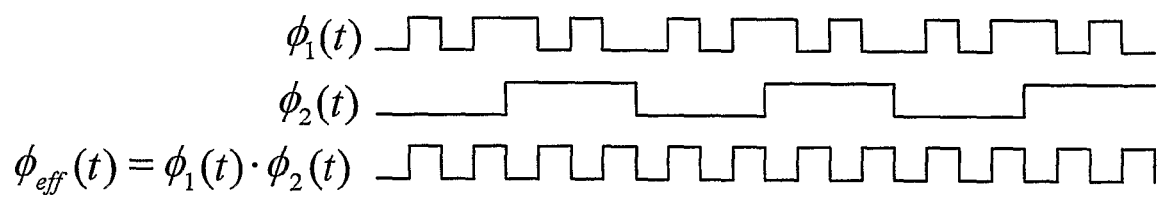
FIG. 2 is a timing diagram illustrating the virtual local oscillator mixer waveforms.
Figure 3:
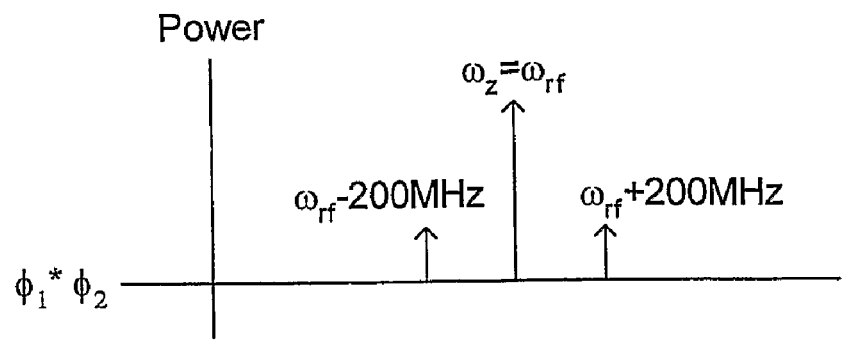
FIG. 3 is an approximate power spectrum of $\phi_1+\phi_2$ for illustrating the generation of unwanted tones due to mixer signal error in the virtual local oscillator receiver of FIG. 1.
Figure 4:
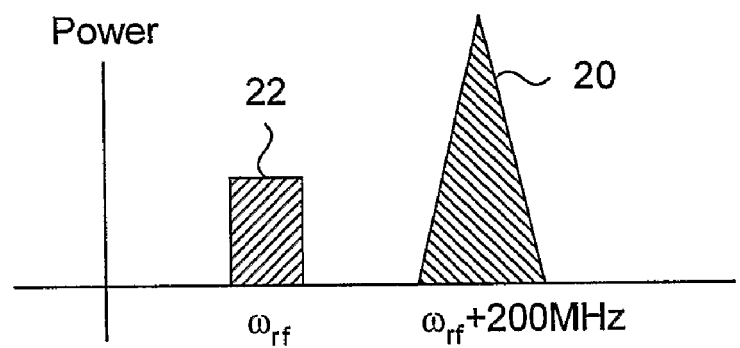
FIG. 4 is a power spectrum plot illustrating corresponding position of a blocker signal at the unwanted tone of FIG. 3.
Figure 5:
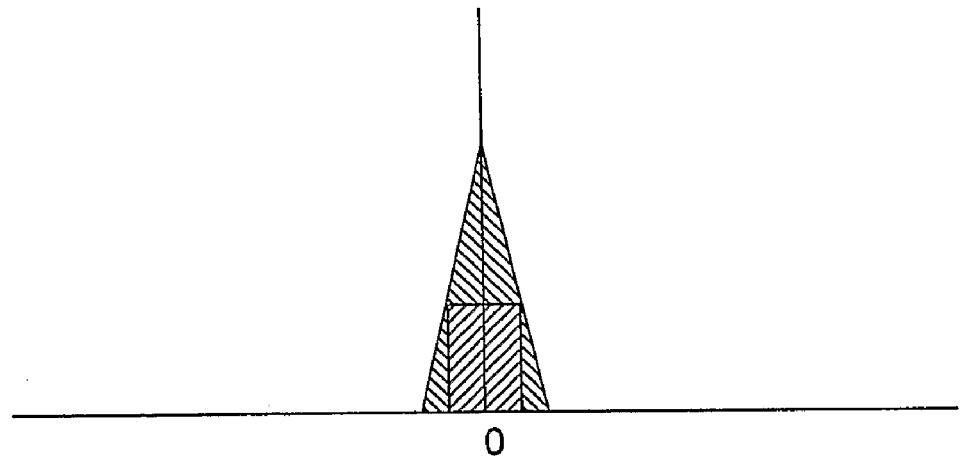
FIG. 5 is a power spectrum plot illustrating the result of down conversion of the blocker signal with the desired signal.
Figure 6:
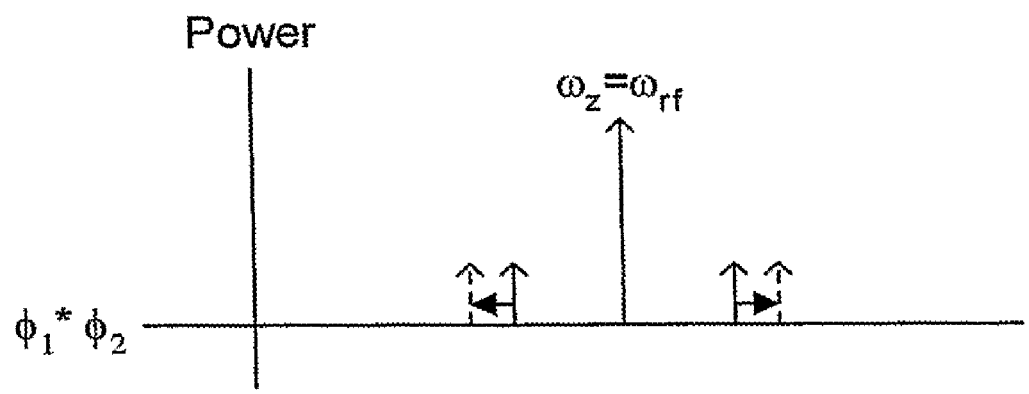
FIG. 6 is a power spectrum plot illustrating the effect of adjusting one of the mixer signals by a predetermined frequency value, according to an embodiment of the present invention.
Figure 7:
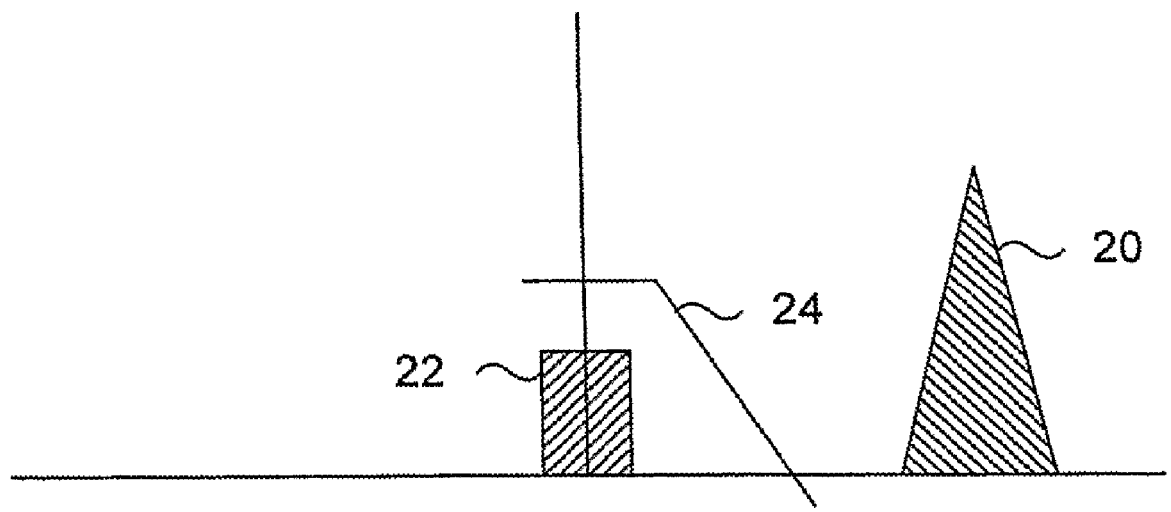
FIG. 7 is a power spectrum plot illustrating a down-conversion result after adjusting one of the mixer signals by the predetermined frequency value, according to an embodiment of the present invention.

The embodiments of the present invention take advantage of a property of virtual local oscillator circuits, such as VLO receiver 10 shown in FIG. 1. In the VLO receiver 10 shown in FIG. 1, the location of the spurious profile of $\phi_1*\phi_2$ in the frequency domain can be modified by adjusting $\phi_2$. The dominate frequency, being the frequency having the highest power of $\phi_1*\phi_2$, will be at the RF frequency which is independent of the frequency $\phi_2$ is set to. Accordingly, by adjusting $\phi_2$, the location of the spurious signal can be shifted as shown in FIG. 6. After down conversion, the spectrum will appear as shown in FIG. 7, with the unwanted signal 22 being separated from the desired signal 20. With the two signals being segregated, a low pass filter function 24 can be applied to filter out unwanted signal 22.

Another useful property that the embodiments of the present invention take advantage of is the power of the desired signal and the overlapping blocker signal. As previously discussed, unwanted power at the spurious frequency in $\phi_1*\phi_2$ will down convert a block signal located at the spurious frequency, such that the blocker signal is down converted on top of the wanted signal. However, this down converted power of the unwanted signal will be attenuated by the difference between the power of the wanted signal minus the power of the unwanted blocker signal, which can be approximately 37 dB for example. If RF wanted denotes the wanted RF power, and WmU denotes Wanted power minus Unwanted power, the total amount of power at base band can be expressed as:

$$BBpower = RFwanted + 10^{\wedge}(-WmU/10)*RFunwanted$$

This combined power typically exceeds expected power of the desired signal by an amount of $10^{\wedge}(-WmU/10)*RFunwanted$. Therefore, the presence of this magnitude of power is indicative of a situation in which an unwanted blocker signal is overlapping a desired signal, resulting from $\phi_2$ inaccuracy in the VLO receiver. Therefore, it follows that by shifting the unwanted blocker signal away from the desired signal in the $\phi_1*\phi_2$ frequency domain, the BBpower will drop by an amount of approximately $10^{\wedge}(-WmU/10)*RFunwanted$.

Accordingly, the blocker signal overlap with the desired signal can be eliminated by adjusting the frequency of $\phi_2$ such that the RFunwanted tone does not fall on top of the wanted signal at base band. In addition to adjusting the frequency of $\phi_2$, the time delay of $\phi_2$ can be adjusted to modify the value WmU. In either approach, the BBpower is minimized.

With these properties of the VLO receiver 10, methods for detecting and correcting for a blocker signal have been developed for VLO receiver 10, or similar systems that combine two mixer signals to produce an effective desired local oscillator signal. Two schemes can be used for removing a blocking signal from overlapping a desired signal. The first is to use preselected $\phi_2$ values that are known to remove a blocking signal based on field trials or simulations. These values can be stored in memory and selected for a particular channel and standard, or a combination of different channels and standards. The second is dynamic correction of the spurious profile so that a blocker signal will not be placed onto the desired signal in base band.

The implementation embodiment of the first scheme will be described with reference to FIG. 8. In the simplified VLO receiver system 100 of FIG. 8, a receiver path 102 similar to VLO receiver 10 shown in FIG. 1, receives $\phi_1$ and $\phi_2$ provided by VLO generator 104. VLO generator can also be referred to as a synthesizer circuit. A memory 106 storing the predetermined $\phi_2$ values for different channels and different standards, provides a selected $\phi_2$ value to VLO generator 104. Configuration logic 108 addresses the appropriate $\phi_2$ value based on the presently used channel and standard. The memory 106 can be implemented in the radio, in the processor, or in a discrete memory on a printed circuit board of the wireless device. The selection of $\phi_2$ is based on a system understanding of where spurious tones can be placed so that they do not significantly degrade the wanted RF signal. As an example, $\phi_2$ can be selected based on the following criteria: 1) No spurious content is within the bandwidth of the all the channels; and 2) The first spurious value is >10 MHz from the edges of the band.

Figure 8:
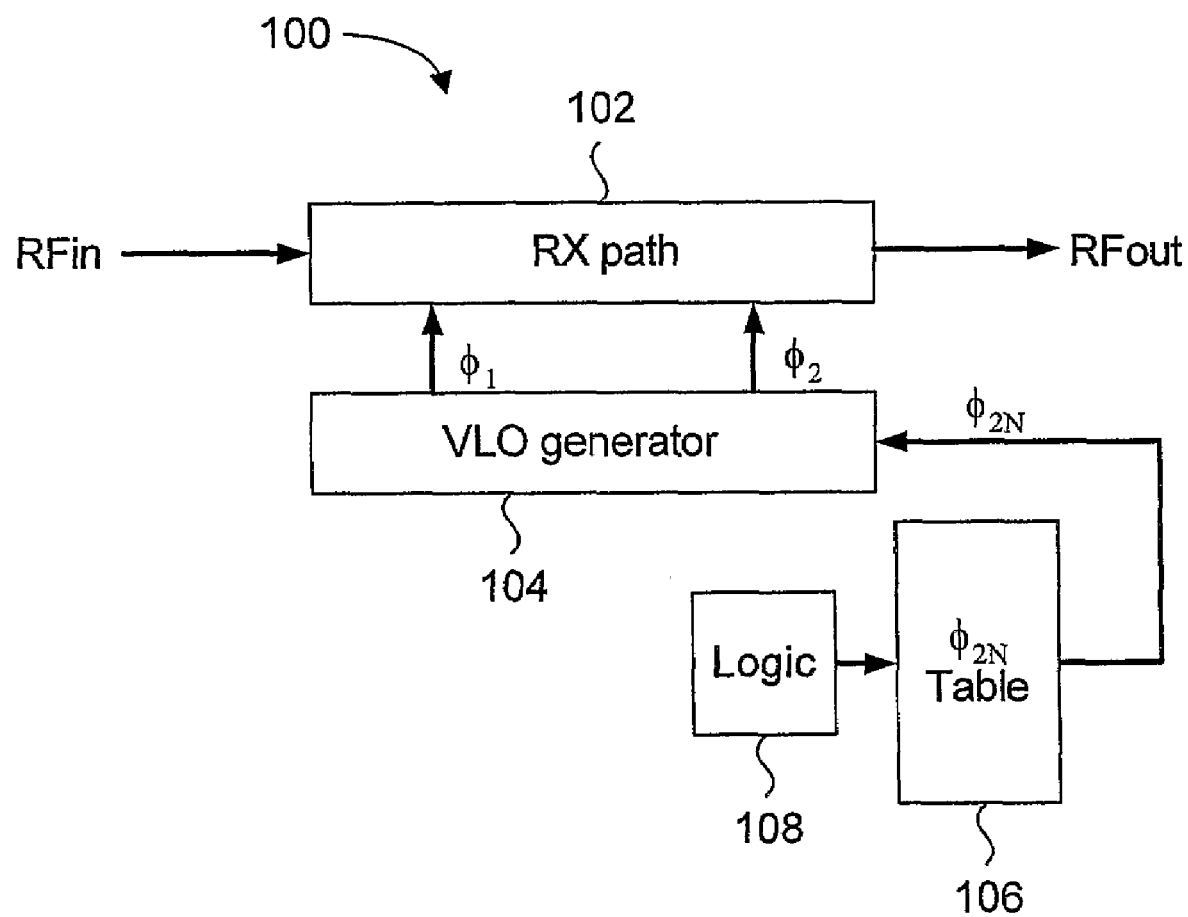
FIG. 8 is a block diagram of a simplified VLO receiver circuit using preset $\phi_2$ values to remove spurious signals, according to an embodiment of the present invention.

The corresponding method for operating the simplified VLO receiver system 100 of FIG. 8 is straightforward. The channel/standard logic 108 detects the standard being used and the communication channel, and addresses the appropriate $\phi_2$ value from memory 106. This selected $\phi_2$ value is provided to VLO generator 104, which generates the new $\phi_2$ value. Unfortunately, this scheme would not be effective for standards adopted after the $\phi_2$ values have been programmed, and the $\phi_2$ values are limited by the number of different test conditions or simulations that are performed.

Therefore, the dynamic correction scheme may be the more suitable method since it does not require any knowledge of operating standards, or feedback from testing/simulation of signals to determine appropriate $\phi_2$ values. A method for dynamic detection and removal of a blocker signal from an RF input signal will now be discussed with reference to FIG. 9.

Figure 9:
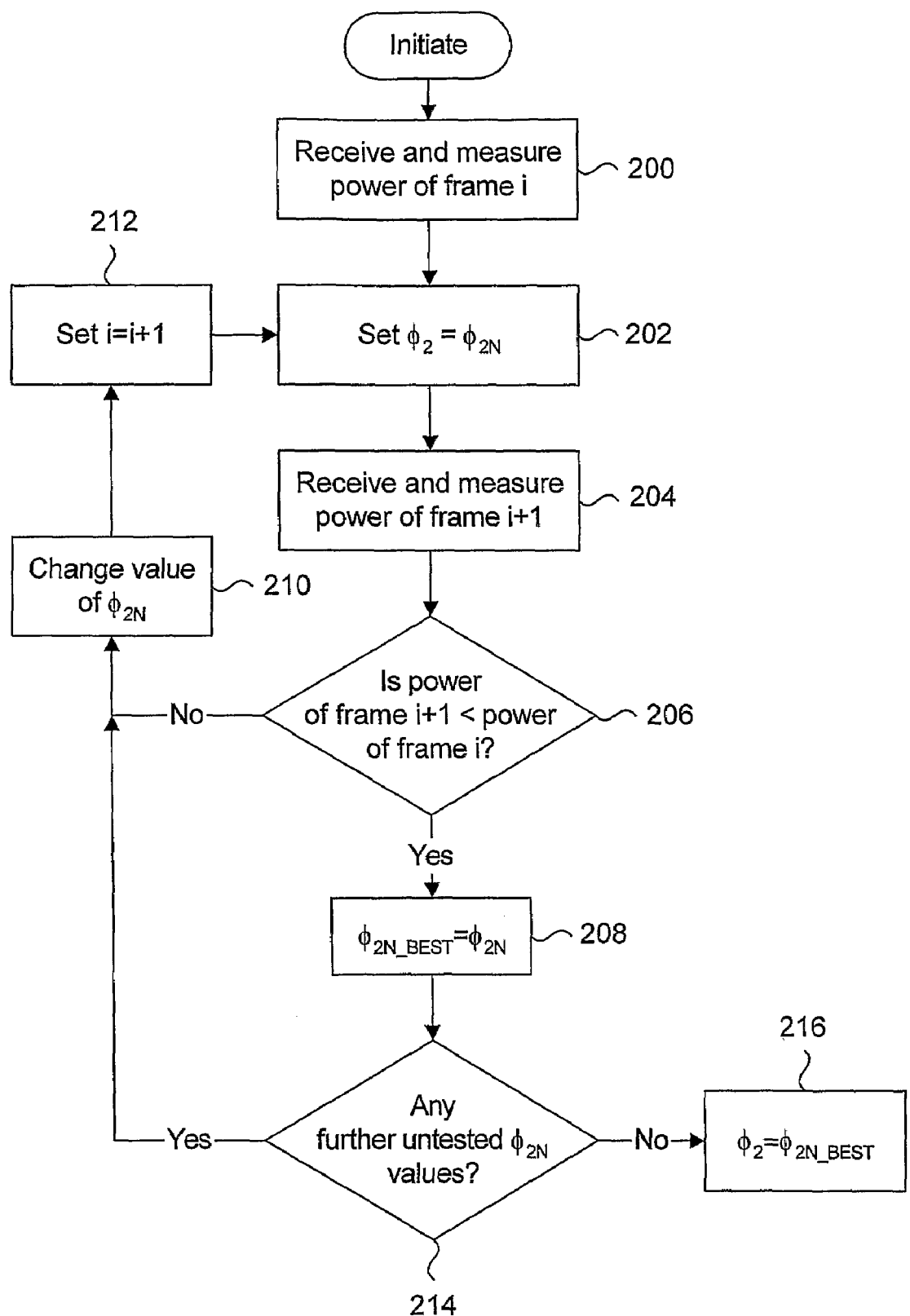
FIG. 9 is a flow chart of a method for dynamic spurious correction in a VLO receiver circuit, according to an embodiment of the present invention.

The method of FIG. 9 operates in the wireless communication context, where data is transmitted in a series of frames, where each frame can be hundreds of microseconds in duration and received in succession by a receiver. For example, the GSM standard specifies frame durations of 577 microseconds. Once down converted with the VLO receiver, each received frame will have an associated base band power which may include a blocking signal overlapping the desired signal, as previously noted. Therefore, according to the present embodiment, $\phi_2$ can be adjusted for each successive frame until the base band power is minimized.

The method of FIG. 9 includes two distinct phases. The first phase involves the detection of the presence of an overlapping blocker signal, or some other suitable trigger, which will initiate the second phase. While detection of the overlapping blocker signal can be monitored frame to frame, the initiation of the second phase can be automatic upon power up reset of the wireless device. Further discussion of blocker signal detection techniques will be described later with reference to FIGS. 10 and 11. The second phase is a $\phi_2$ adjustment loop for shifting the blocker signal away from the desired signal. Generally, this adjustment loop will identify the $\phi_2$ value yielding the lowest base band power.

The method of FIG. 9 assumes that some entry condition has been met. The process starts at step 200 where an initial frame i is received and its power is measured. It is assumed that i=0 at step 200 for the initial frame i. Buffering can be used to store the measured power value. At step 202, $\phi_2$ is set to a new value $\phi_{2N}$, where $\phi_{2N}$ can be $\phi_2$ plus an incremented frequency value or simply a preselected frequency value from a table. For example, if $\phi_2$ can be controlled between 150 MHz to 400 MHz, the incremental step size can be set to 400 KHz. The next frame, frame i+1, is received at step 204 with the new $\phi_2$ value and its power level is measured. The power of frame i+1 is compared to the power of frame i at step 206. If the power of frame i+1 is less than the power of the previous frame i, then the process proceeds to step 208 where temporary buffer variable $\phi_{2N\_BEST}$ stores the present value of $\phi_{2N}$. The lower power of new frame indicates that the present value of $\phi_{2N}$ is effective in shifting the blocker signal away from the desired signal. Otherwise, if the power of frame i+1 is not less than the power of the previous frame i, then the value of $\phi_{2N}$ is changed to another value at step 210. At step 212, integer i is incremented to i=1 to logically represent the next successive frame to be received. Thus far, the power of two frames, frames 0 and 1 have been compared to each other. Continuing at step 202, $\phi_2$ is set to $\phi_{2N}$ and the process repeats through steps 204 and 206, but for frames 1 and 2. The loop consisting of steps 202, 204, 206, 210 and 212 would continue until the power of a new frame corresponding to a new $\phi_{2N}$ value is found to be less than the power of the previous frame.

Resuming from step 208, the method checks to see if there are any further $\phi_{2N}$ values to use at step 214, since another value may result in even less power. If there are further values to use, then the method loops back to step 210 and the next frame is received with the next $\phi_{2N}$ value. If this new $\phi_{2N}$ value yields even less power, then this value is stored as $\phi_{2N\_BEST}$ instead. If at step 214 there are no further values to use, then the process ends at step 216 and $\phi_2$ is set to $\phi_{2N\_BEST}$ for the remaining frames of the transmission.

The presently described method compares a new frame with a previous frame. In a modification of the method, if the power of the new frame is not less than the power of the initial frame, then the power of successive new frames can be compared to the initial frame. For example, frames 1, 2, and 3 can be compared to frame 0. The process can be simplified to end immediately as soon as a $\phi_2$ value resulting in a lower power is detected.

Figure 10:
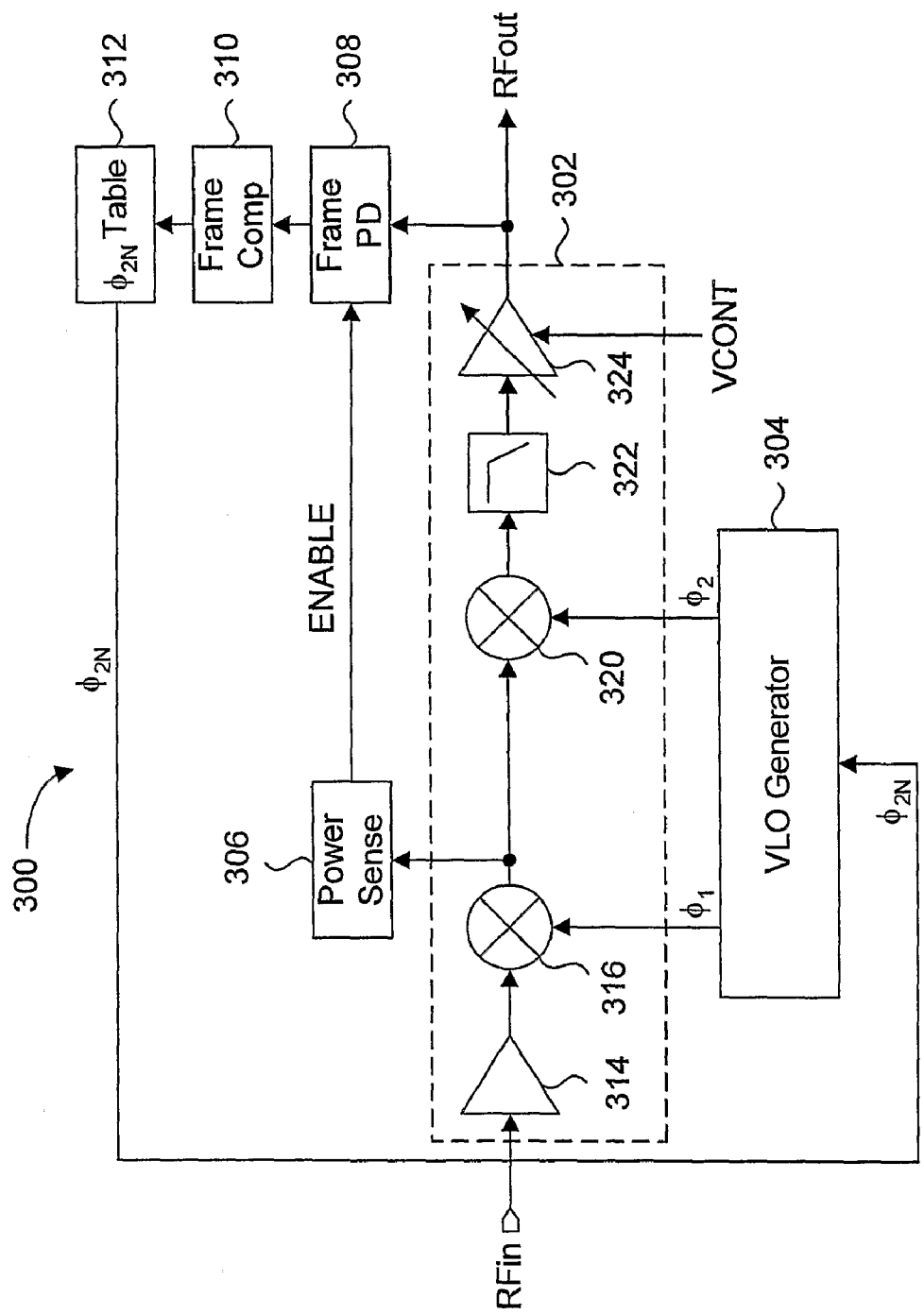
FIG. 10 is a schematic of a VLO receiver with a power sensing enabled blocking signal reduction system according to an embodiment of the present invention; and, FIG. 11 is a schematic of a VLO receiver with a gain difference enabled blocking signal reduction system according to an embodiment of the present invention.
Figure 11:
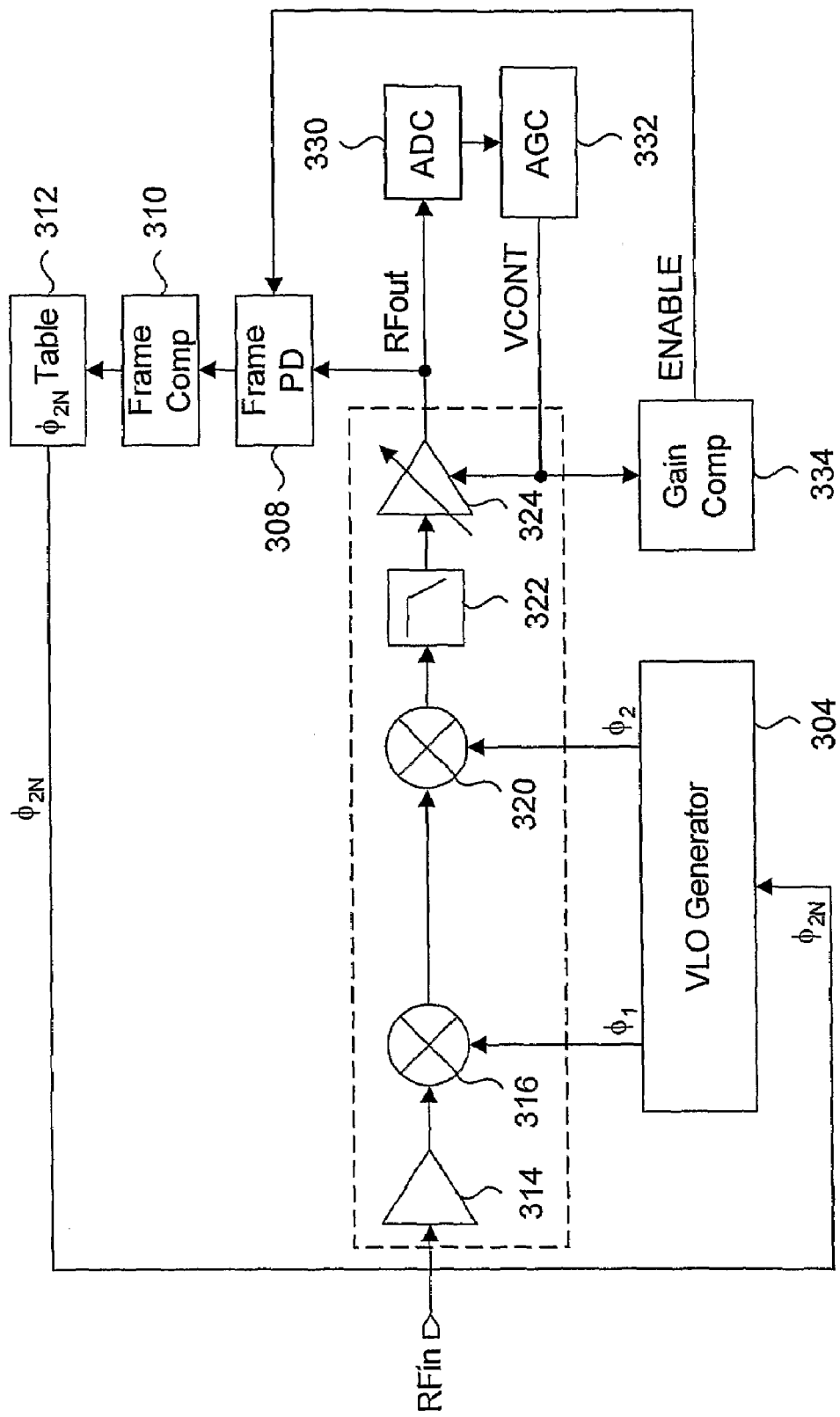

FIGS. 10 and 11 are schematics of a VLO receiver with a dynamic blocking signal reduction system for executing the previously described method of FIG. 9. FIGS. 10 and 11 include the same blocker signal reduction system, with the exception of the blocker detection circuit that is implemented differently.

The VLO receiver with blocking signal reduction system 300 shown in FIG. 10 includes a VLO receiver path 302, a VLO signal generator 304, and a blocker signal reduction system consisting of blocks 306, 308, 310 and 312. Block 306 functions as a blocker detection circuit, while blocks 308, 310 and 312 function as a dynamic correction circuit for adjusting the value of mixer signal $\phi_2$. VLO receiver path 302 includes a low noise amplifier 314, a first mixer 316, a second mixer 320, filter 322, and variable gain amplifier 324. RF input signal RFin is received at an input node of low noise amplifier 314, and is eventually down converted to a desired local oscillator frequency through the combination of $\phi_1$ and $\phi_2$ via mixers 316 and 320. Variable gain amplifier 324 is controlled by signal VCONT to adjust the desired gain of output signal RFout.

VLO generator 304 is responsible for generating $\phi_1$ and $\phi_2$, the implementation details thereof being described in U.S. Pat. No. 6,727,764. The present generator is slightly modified to receive a control signal representing a new $\phi_2$ frequency value that can be generated by the circuit. VLO generator 304 can include registers for storing a default $\phi_2$ value that can be used at power up or reset of the wireless device. Configurable frequency generators are known in the art, and any person of skill in the art would be able to apply these standard techniques to implement the VLO generator 304 with for configurable $\phi_2$ generation.

In the present embodiment, blocker detection circuit 306 is implemented as a power sensing circuit for detecting a power characteristic of signal RFin. The power sensing circuit is preferably coupled to the output of mixer 316, but can be connected to any suitable node of the VLO receiver path 302 where a power of the signal can be measured. The power sensing circuit 306 will compare the measured power of the signal to a predetermined threshold, and generates an enable signal ENABLE in response to a measured power that is at least the threshold power. Generally, this threshold is set with the knowledge that a power level exceeding the threshold will indicate the presence of a blocker signal with the desired signal.

The dynamic correction circuit includes a frame power detector 308 coupled to RFout for sensing a power level, a frame power comparator 310 for comparing the sensed power level to a power level of a previous frame, and a memory 312 storing a table of different $\phi_{2N}$ frequency values. Although not shown, the dynamic correction circuit can include a timer which determines when the next power measurement should be made after a new $\phi_2$ value is loaded in. The timer may have information of which RF frame it is looking at, or when the next value of $\phi_2$ has settled so the next power measurement can be taken. The timer can be implemented in frame power detector 308. The frame power comparator 310 can provide a memory access signal for memory 312, such that memory 312 will provide a new $\phi_{2N}$ frequency value to VLO generator 304 if the sensed power of the current frame is still equal to or greater than that of the previous frame. The memory 312 can include a counter for keeping track of the values that have been previously used, and the counter can be integrated within the addressing logic of memory 312 to be responsive to the memory access signal for selecting the next $\phi_{2N}$ frequency value to use. Hence the memory access signal can function as a toggle signal for incrementing the counter. The location of the described additional components are exemplary only, and any person of skill in the art will understand that they can be implemented separately as distinct circuits, or in other blocks of the dynamic correction circuit.

In operation, when power sensing circuit 306 generates ENABLE, the process described in FIG. 9 is executed by the dynamic correction circuit of FIG. 10. More specifically, steps 200 and 204 can be executed by frame power detector 308, step 202 can be executed by VLO signal generator 304, steps 206, 208 and 214 can be executed by logic in frame power comparator 310, and step 210 can be executed by memory 312. Step 216 can also be executed in VLO signal generator 304. Frame power comparator 310 can include a buffer for storing a sensed power of a previous frame, for comparison against the power of a current frame.

FIG. 11 includes all the same numbered elements as in FIG. 10, except that blocker detection circuit 306 is now implemented with an automatic gain control (AGC) loop in an on-board microprocessor. More specifically, the AGC loop includes an analog to digital converter (ADC) 330 for receiving RFout, and an auto gain control circuit (AGC) 332 for receiving a digitized output of ADC 330 and providing a control voltage VCONT back to variable gain amplifier 324. Those of skill in the art will understand that the AGC loop is a standard circuit of the transceiver chip. In the present embodiment, the blocker detection circuit includes gain comparison circuit 334 coupled to AGC 332, which monitors the difference in gain between a current frame and the previous frame by measuring the voltage level of VCONT. This difference is then compared to a predetermined difference threshold. In the present example, an acceptable gain difference threshold can be at least 5 dB. Signal ENABLE will be generated when the gain drop exceeds the predetermined value, to enable the dynamic correction circuit.

In principle, the AGC loop will try to maintain the RFout node at a predetermined value, such as 20 mV for example. Since the power of the signal is high in the presence of a blocker signal, the node may jump as high as 60 mV for example. Hence the AGC will signal the variable gain amplifier 324 to reduce the gain. This reduction in gain can therefore indicate the presence of a blocker signal. Accordingly, to monitor the difference in gain between two successive frames, the gain comparison circuit 334 can include buffers or registers to store the gain value of the previous frame for comparison with the gain value of the current frame.

The embodiments of the invention shown in FIG. 8 and FIG. 10 or 11 can be combined to provide system robustness. The preselected $\phi_2$ values scheme can be used first to mitigate the effects of blocker signals, and the dynamic correction scheme can then be employed should the first scheme fail to remove the blocker signal from the RF input, which can be detected using the blocker detection circuits shown in FIGS. 10 and 11.

It should be noted that the dynamic correction scheme described in FIGS. 9 to 11 can be initiated through other well known methods. For example, the base band processor can be pre-programmed with a variety of conditions that signal a "bad" frame which can be corrected using the disclosed dynamic correction scheme. Therefore, the blocker detection circuits shown in FIGS. 10 and 11 are optional circuits, which can be used in combination with the base band processor evaluation algorithms to detect the presence of a bad frame, corresponding to a deficient RF input signal, in order to initiate the disclosed dynamic correction scheme. The deficient status of an RF input signal can correspond to any number of preset conditions in the base band processor, or the presence of a blocker signal as previously discussed. Alternately, the blocker detection circuits can be omitted, such that initiation of the dynamic correction scheme can be controlled by the RF input signal status algorithms and circuits in the base band processor. Accordingly, the blocker detection circuits and the algorithms of the base band processor can be considered evaluation means for checking the state of the RF input signal or frame.

Those of skill in the art will understand that the ENABLE signal can be logically combined with secondary enable signals. For example, if the receiver circuit is turned off, then there is no need to activate the dynamic correction scheme circuits. In another example, knowing that the amplifier circuit has 20 dB to 5 dB range, only signals at the 20 dB level could present a potential blocking signal problem.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A blocking signal reduction system for a virtual local oscillator receiver receiving an RF input signal and providing a corresponding base band signal, comprising:

a synthesizer circuit for generating a first mixer signal and a second mixer signal, the virtual local oscillator receiver receiving the first mixer signal and the second mixer signal for down converting the RF input signal to an effective local oscillator frequency, the down converted RF input signal being provided as the corresponding base band signal evaluation means for receiving the down converted RF input signal and for generating an enable signal when the down converted RF input signal is determined to be deficient;

a dynamic correction circuit for sensing a power of the corresponding base band signal, and for providing a new frequency value in response to the enable signal, the synthesizer circuit adjusting a frequency of the second mixer signal to correspond with the new frequency value;

wherein the evaluation means includes a blocker detection circuit coupled to the virtual local oscillator receiver for sensing a characteristic corresponding to the down converted RF input signal, the blocker detection circuit generating the enable signal in response to the sensed characteristic exceeding a predetermined threshold;

wherein the down converted RF input signal includes RF input frames, and the corresponding base band signal includes base band frames; and, wherein the dynamic correction circuit includes a rower detector circuit for receiving and sensing the power of a first base band frame and the power of a second base band frame in response to the enable signal, a comparator circuit for comparing the power of the second base band frame to the power of the first base band frame, the comparator circuit generating a memory access signal when the rower of the first base band frame is less than or equal to the power of the second base band frame, and a memory for storing a plurality of new frequency values and for providing one of said new frequency values to the synthesizer circuit in response to the memory access signal.

2. The blocking signal reduction system of claim 1, wherein the dynamic correction circuit includes a timer for controlling the power detector circuit to measure the power of the second base band frame at a set time after the power of the first base band frame is measured.

3. The blocking signal reduction system of claim 1, wherein the dynamic correction circuit includes a counter responsive to the memory access signal for providing each of the new frequency values.

4. A method for eliminating a blocking signal in an RF input signal received by a virtual local oscillator receiver, the virtual local oscillator receiver receiving a first mixer signal and a second mixer signal for generating a corresponding base band signal, the method comprising a) detecting the presence of the blocking signal in the RF input signal;

b) changing a value of the second mixer signal;

c) sensing a power of the corresponding base band signal;

d) repeating steps b) and c) until a preset condition is satisfied;

wherein the RF input signal includes RF input frames, and the corresponding base band signal includes base band frames;

wherein the step of sensing includes sensing a rower of a first base band frame;

wherein the step of repeating includes sensing a power of a second base band frame and comparing the power of the second base band frame to the power of the first base band frame; and, wherein a table stores a predetermined number of frequency values.

5. The method of claim 4, wherein the step of repeating includes changing the value of the second mixer signal to correspond with a different frequency value stored in the table for each iteration.

6. The method of claim 5, wherein the preset condition includes having changed the value of the second mixer signal with all the frequency values stored in the table.

7. The method of claim 6, wherein a buffer stores the frequency value of the second mixer signal corresponding to the base band frame having the lowest power.

* * * * *